United States Patent
Wang et al.

(10) Patent No.: US 9,425,369 B2
(45) Date of Patent: Aug. 23, 2016

(54) ARRAY SUBSTRATE, DISPLAY PANEL AND PREPARING METHOD THEREOF

(71) Applicant: Beijing BOE Optoelectronics Technology Co., Ltd., Beijing (CN)

(72) Inventors: Deshuai Wang, Beijing (CN); Jian Guo, Beijing (CN)

(73) Assignee: BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 13/946,250

(22) Filed: Jul. 19, 2013

(65) Prior Publication Data
US 2014/0084319 A1    Mar. 27, 2014

(30) Foreign Application Priority Data

Sep. 24, 2012    (CN) .............................. 201210358702

(51) Int. Cl.
*H01L 33/00*    (2010.01)
*H01L 33/58*    (2010.01)
*G02F 1/1335*    (2006.01)

(52) U.S. Cl.
CPC ......... *H01L 33/58* (2013.01); *G02F 1/133526* (2013.01); *G02F 2001/133565* (2013.01); *G02F 2201/40* (2013.01)

(58) Field of Classification Search
CPC ....................................... H01L 33/58
USPC .......................................................... 257/98
See application file for complete search history.

(56) References Cited

U.S. PATENT DOCUMENTS

| | | | |
|---|---|---|---|
| 2002/0167636 A1 | 11/2002 | Yasuda et al. | |
| 2011/0104838 A1* | 5/2011 | Ahn et al. | ........................ 438/30 |
| 2011/0234580 A1* | 9/2011 | Wang | .................. G02B 3/0043 345/418 |

FOREIGN PATENT DOCUMENTS

| | | |
|---|---|---|
| CN | 1782835 A | 6/2006 |
| JP | 2001-4988 A | 1/2001 |
| JP | 3289527 B2 | 6/2002 |
| JP | 2002341375 A | 11/2002 |
| JP | 2006154577 A | 6/2006 |
| KR | 20070108969 A | 11/2007 |
| KR | 20070108969 A | 11/2007 |

OTHER PUBLICATIONS

Office Action issued by the Korean Patent Office for Korean Patent Application No. 10-2013-0084737 dated Mar. 28, 2015, 4 pgs.
English translation of Office Action issued by the Korean Patent Office for Korean Patent Application No. 10-2013-0084737 dated Mar. 28, 2015, 2 pages.

(Continued)

*Primary Examiner* — Douglas Menz
(74) *Attorney, Agent, or Firm* — Ladas & Parry LLP

(57) ABSTRACT

An array substrate, a display panel and a preparing method thereof are disclosed. The array substrate comprises: a substrate, a gate line and a data line disposed on the substrate, a protective layer covering the gate line and/or data line; a light converging structure is disposed on the protective layer over the gate line and/or the data line.

12 Claims, 3 Drawing Sheets

(56) References Cited

OTHER PUBLICATIONS

Patent certificate No. ZL 201210358702.8 (Chinese language), issued by State Intellectual Property Office of P.R.C., issued on Mar. 25, 2015.
English abstract of JP 2001-4988 A (Foreign patent document, above).
English abstract of JP 3289527 B2 (Foreign patent document, above).
English abstract of CN 1782835 A (Foreign patent document, above).
Korean Office Action issued by the Korean Patent Office for Korean Patent Application No. 10-2013-0084737 dated Jun. 30, 2014, 5pgs.
English translation of Korean Office Action issued by the Korean Patent Office for Korean Patent Application No. 10-2013-0084737 dated Jun. 30, 2014, 3pgs.
First Office Action issued by the Chinese Patent Office for Chinese Patent Application No. 201210358702.8 for Chinese Patent Application No. 201210358702.8 dated Jul. 2, 2014, 9pgs.
English translation of First Office Action issued by the Chinese Patent Office for Chinese Patent Application No. 201210358702.8 for Chinese Patent Application No. 201210358702.8 dated Jul. 2, 2014, 7pgs.
Extended European Search Report for European Patent Application No. 13174198.5 dated Jan. 20, 2014.
Korean Notice of Allowance dated Sep. 30, 2015 Appln. No. 10-2013-0084737.

\* cited by examiner

ARRAY SUBSTRATE, DISPLAY PANEL AND PREPARING METHOD THEREOF

CROSS REFERENCE TO RELATED APPLICATIONS

This application claims priority from Chinese National Application No. 201210358702.8, filed on Sep. 24, 2012, the contents of which are incorporated herein by reference.

TECHNICAL FIELD

Embodiments of the present invention relate to an array substrate, a display panel and a preparing method thereof.

BACKGROUND

Liquid crystal display technologies have been rapidly developed in the recent decades. The current liquid crystal display normally comprises a thin film transistor (hereinafter "TFT") array substrate, a liquid crystal layer and a color filter (hereinafter "CF") substrate disposed sequentially from bottom up. The liquid crystal layer is contained within a liquid crystal cell formed by the TFT array substrate and the CF substrate that are disposed opposite to each other.

SUMMARY

One aspect of the present invention provides a preparing method of an array substrate, comprising a substrate, a gate line and a data line disposed on the substrate, a protective layer covering the gate line and/or the data line; a light converging structure is disposed on the protective layer over the gate line and/or the data line.

Another aspect of the present invention provides a display panel, comprising the aforesaid array substrate.

A further aspect of the present invention provides a preparing method of the array substrate, comprising: forming a gate line and a data line on a substrate; forming a protective layer on the gate line and the data line; and forming a light converging structure on the protective layer over the gate line and/or the data line.

BRIEF DESCRIPTION OF THE DRAWINGS

In order to clearly illustrate the technical solution of the embodiments of the invention or in the prior art, the illustrative drawings used for describing the embodiments will be briefly described in the following.

DETAILED DESCRIPTION

The array substrate, the display panel and the preparing method thereof in the embodiments of the invention will be herein described in details with reference to the drawings. It shall be clarified that the described embodiments are just a part but not all of the embodiments of the invention. Based on the described embodiments herein, those skilled in the art can obtain other embodiment(s), without any inventive work, which should be within the scope of the invention.

Unless otherwise defined, the technical or scientific terms used herein shall have the general meanings understandable for those ordinarily skilled in the field of the present invention. The words such as "a", "an", "the" or similar shall not represent limitation of numbers, but mean existence of at least one. The phrases such as "include", "comprise" or similar intend to mean the elements or objects before such words cover or are equivalent to the elements or objects listed after such words, but other elements or objects are not exclusive. The phrases "joint", "connect" or similar are not limited to physical or chemical connection, but also include electrical connection, no matter directly or indirectly. The phrases "upper", "lower", "left", "right" and etc. shall be used only to represent relative positions, wherein, when the absolute position of the described object is changed, the relative positions may be changed accordingly.

It is found by the inventors that the existing liquid crystal panels have at least the following problems: when forming a liquid crystal cell by disposing the array substrate and the color filter substrate opposite to each other, an alignment deviation may occurs between the array substrate and the color filter substrate, whereby the pixel electrode may be partially shielded by a black matrix, which causes light leakage, due to the excessive distance between two adjacent pixel electrodes or misalignment. In order to avoid image sticking caused by light leakage, the length of the black matrix needs to be increased so as to lower the aperture ratio of the color filter substrate.

Thus, the embodiments of the present invention involve an array substrate, a display panel and a preparing method thereof.

Embodiment 1

The present embodiment provides an array substrate 11, and this array substrate may be disposed opposite to an opposed substrate to form a liquid crystal cell for accommodating liquid crystal materials therein.

Figure 1:
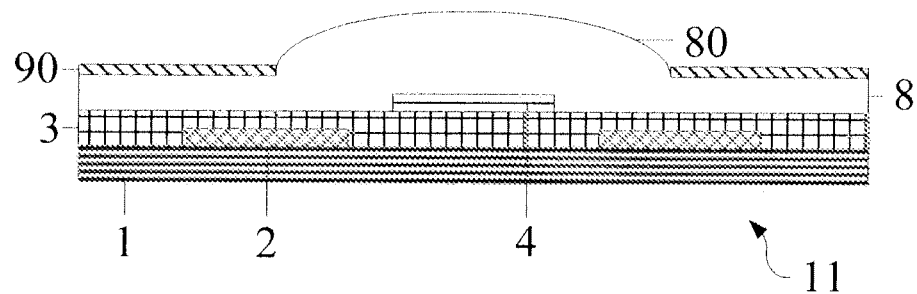
FIG. 1 is a cross-sectional schematic view of the array substrate according to Embodiment 1 of the present invention.
Figure 2:
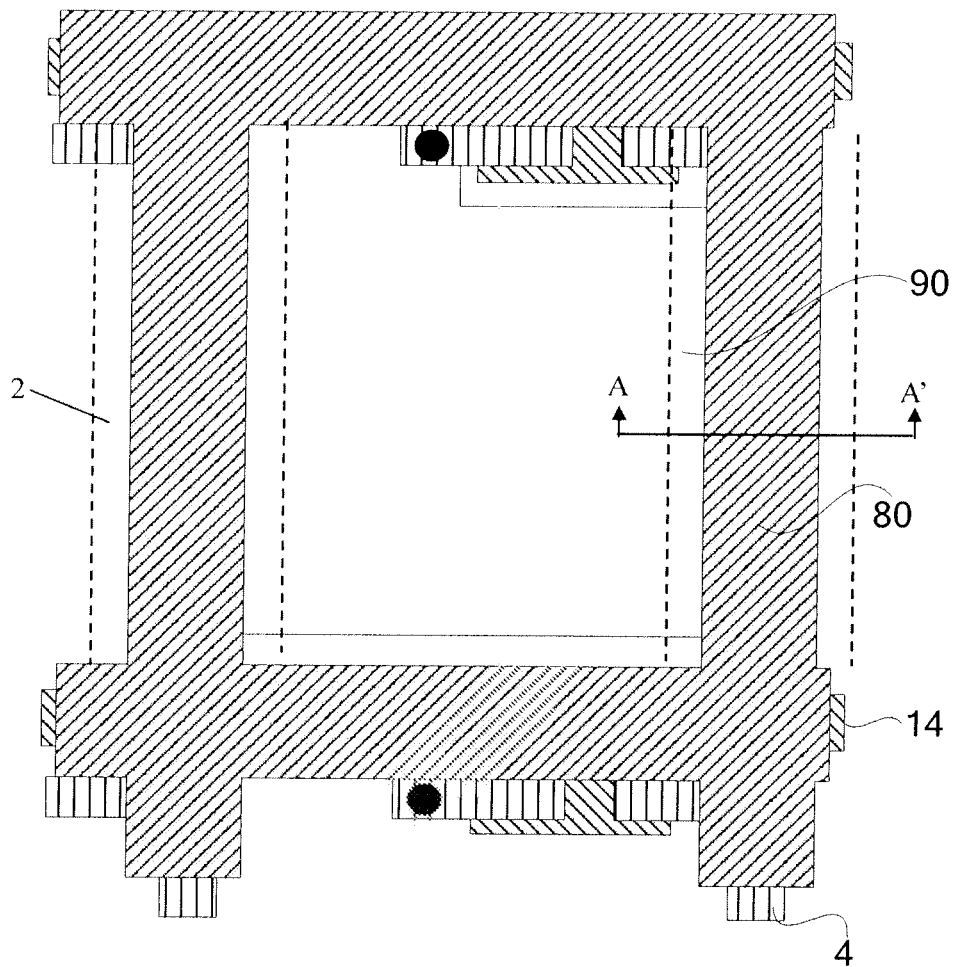
FIG. 2 is a top view of the TFT array substrate according to Embodiment 1 of the present invention.

FIG. 1 and FIG. 2 show schematic views of the array substrate. FIG. 1 corresponds to a cross-sectional schematic view along line A-A in FIG. 2.

As shown in FIG. 1 and FIG. 2, the array substrate 11 comprises: a substrate 1, gate lines 14 and data lines 4 disposed on the substrate 1, and a protective layer 8 covering the gate lines 14 and/or data lines 4. A light converging structure 80 is disposed on the protective layer 8 over the position corresponding to a gate line 14 and/or a data line 4. That is, the light converging structure 80 may be located over any one of the gate lines 14 and the data lines 4. The gate lines 14 and the data lines 4 intersect each other to define a plurality of pixel units.

Each of the pixel units comprises a thin film transistor as a switch element, and a pixel electrode for controlling orientation of liquid crystal. For example, in each pixel, a gate electrode of the thin film transistor is electrically connected to or integrally formed with a corresponding gate line, a source electrode thereof is electrically connected to or integrally formed with a corresponding data line, and a drain electrode thereof is electrically connected to or integrally formed with a corresponding pixel electrode.

With the light converging structure 80 disposed on a gate line 14 and/or a data line 4, the lights emitted from both sides of the gate line and/or the data line on the array substrate are converged to a central portion of the corresponding black matrix, such that the light which might have been leaked out from both sides of the black matrix arrive, after convergence, at the region where the black matrix is located so as to prevent light leakage. Thus, the dimension of the black matrix may be reduced in length and width, whereby the aperture ratio of the opposed substrate is increased while the image sticking caused by the light emission can be avoided. As shown in FIG. 2, the light converging structures 80 are disposed over both the gate line 14 and the data line 4. But, the present embodiment is not limited to this, and the light converging structure 80 may be disposed over either the gate line 14 or the data line 4.

Between the protective layer 8 and the substrate 1, the array substrate further comprises an insulating layer 3; this insulating layer 3 covers the gate lines 14, and the data lines are disposed on a surface of the insulating layer 3. The material for the insulating layer 3 may be nitrogen silicon or photosensitive resin.

Furthermore, the substrate 1 may be provided with light blocking bars 2 covered by the insulating layer 3. The light blocking bars 2 may be disposed in parallel with the gate lines 14 and/or the data lines 4. FIG. 2 only shows that the light blocking bars 2 are disposed in parallel with the gate lines 4 and on both sides of each of the gate lines, but the present embodiment is not limited to this.

Pixel electrodes 90 are disposed on both sides of each light converging structure 80. The pixel electrodes 90 are located within the pixel units defined by the corresponding gate lines and data lines.

With the light blocking bars 2, the light from a backlight module (not shown) and incident to the substrate 1 is shielded so as to limit the exit of the light, and thus further to realize miniaturization of the black matrix and to increase the aperture ratio of the opposed substrate.

In one example, the light converging structures 80 and the protective layer 8 are integrally formed with a photosensitive resin.

An example of the process of forming the protective layer 8 and the light converging structures 80 comprises: depositing a photosensitive resin solution on the insulating layer and the data lines 4; performing pre-baking to form a photosensitive resin layer; forming protrusions by a patterning process; performing post-baking so as to transform the photosensitive resin layer into the protective layer 8 and the light converging structures 80.

By integrally forming the photosensitive resin into the protective layer 8 and the light converging structures 80, the process required for separately forming the light converging structures 80 can be omitted and the production efficiency of the array substrate 11 can be improved.

Since a convex lens structure has a better light converging effect, for example, the light converging structure 80 can be implemented in a convex lens structure.

During the process of post-baking the photosensitive resin layer formed with the protrusions, the photosensitive resin layer contracts inwardly such that the protrusions forms convex lens structures.

Figure 3:
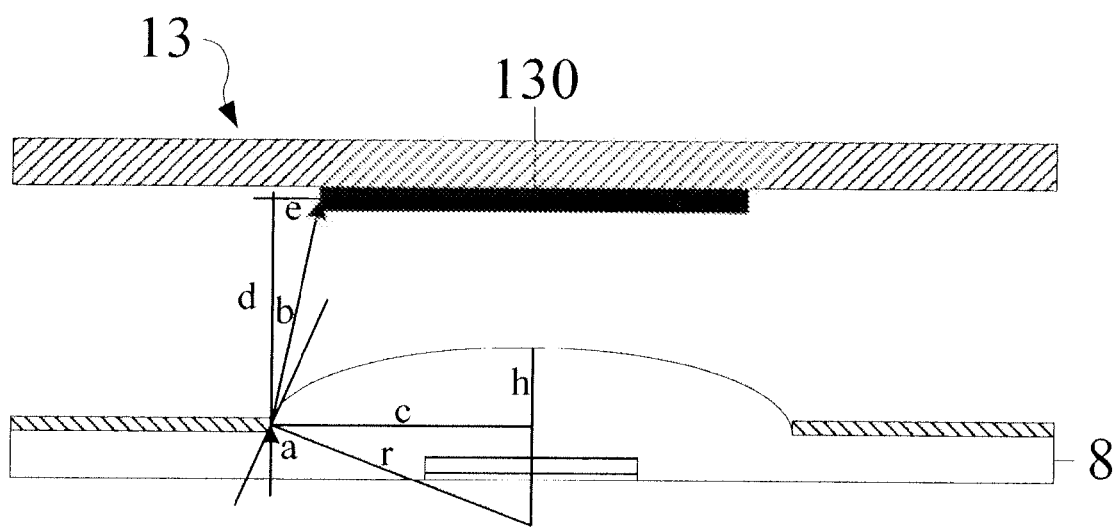
FIG. 3 is a schematic view of the dimensions of structures in the display panel according to Embodiment 1 of the present invention.

In a display panel, the liquid crystal layer 12 normally has a thickness (i.e., the cell thickness of the liquid crystal cell formed by the array substrate and the opposed substrate) of 2-3 µm, and a data line 4 normally has a thickness of 2-3 µm. As for the display panel as shown in FIG. 3, "d" is the thickness of the liquid crystal layer 12, "b" is an angle between the transmission light and the refraction light of the protective layer 8, "a" is an angle between the incident light of the protective layer 8 and the normal line of the edge of the light converging structure 80, "c" is the half of the width of a cross-section of the light converging structure 80, "r" is a curvature radius of the light converging structure 80, and "n1" is the refractivity of the light converging structure 80, and "n2" is the refractivity of the liquid crystal layer 12.

According to the law of refraction and the trigonometric function, it is known that $$r = \frac{c^2 + h^2}{2h},$$

wherein "c" can be adjusted according to the dimensions of the half-tone region 60 on the half-tone mask plate 6 or the grey-tone region 70 on the grey-tone mask 7 during a patterning process (refer to FIG. 6), "h" can be controlled by the rotation speed of a glue application unit, "c" can be controlled by the time period of exposure and development, such that the size of the curvature radius "r" can be controlled and the angle "a" can be determined. Since the materials of the protective layer 8 and the liquid crystal layer 12 have been determined, the angle "b" can be determined by sin a/sin(90−b)=n2/n1. With a given cell thickness of the liquid crystal layer 12, the change range in the width of the black matrix 130 on the CF substrate 13 can be determined in accordance with tan b=e/d. Then, the width of the black matrix 130 can be adjusted according to the change range.

In order to better control the dimensions of the black matrix 130 of the opposed substrate 13 corresponding to the array substrate 11, to avoid image sticking caused by light leakage of the array substrate 11, and further to better adjust the aperture ratio of the opposed substrate to improve brightness of the liquid crystal display, for example, a cross-section height "h" of the light converging structure 80 may be 0.5-1.5 µm, and a cross-section width "c" of the light converting structure 80 may be 1.5-4.5 µm.

Of course, in the embodiments of the present invention, the light converging structure 80 may be disposed either over a data line 4 or over a gate line 14 only, as stated before.

Embodiment 2

Figure 4:
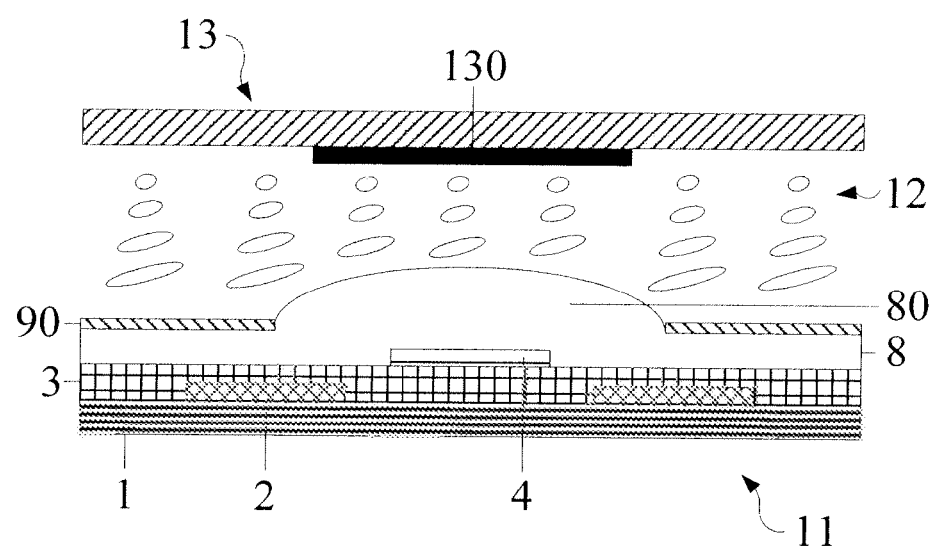
FIG. 4 is a structural schematic view of the display panel according to Embodiment 2 of the present invention.

Corresponding to the array substrate of the aforesaid Embodiment 1, the present embodiment further provides a display panel, as shown in FIG. 4, comprising an array substrate 11 and an opposed substrate 13.

The opposed substrate 13, for example, is a color filter substrate (CF substrate). When a color filter layer (e.g., including RGB filters) is formed on the array substrate 11, the opposed substrate may not include a color filter layer any more. In addition, the opposed substrate 13, as needed, may comprise a common electrode layer for cooperating with the pixel electrodes on the array substrate to form electric fields for driving liquid crystal.

Usually, spacers (e.g., post spacers or ball spacers) are provided between the array substrate 11 and the opposed substrate 13, and for example is fixed by sealant so as to form a liquid crystal cell with a given cell thickness. The liquid crystal cell is filled with liquid crystal and is located between the array substrate 11 and the opposed substrate 13.

The array substrate 11 comprises: a substrate 1, gate lines 14 and data lines 4 disposed on the substrate 1, a protective layer 8 covering the gate lines 14 and/or the data lines 4; light converging structures 80 are disposed on the protective layer 8 and over the gate lines 14 and/or the data lines 4.

The opposed substrate 13 is provided with a black matrix 130 corresponding to the gate lines and data lines on the array substrate 11, such that the black matrix 130 also corresponds to the light converging structures 80.

An insulating layer 3 is disposed between the protective layer 8 and the substrate 1. The insulating layer 3 covers the gate lines 14 and the data lines 4 are disposed on a surface of the insulating layer 3. Furthermore, for example, light blocking bars 2 covered by the insulating layer 3 are disposed on the substrate 1; the light blocking bars 2 may be disposed in parallel with the gate lines 14 and/or the data lines 4. In addition, pixel electrodes 90 are disposed on the protective layer 8 on both sides of the light converging structures 80.

With the light blocking bars 2, the light incident to the substrate 1 is shielded so as to limit the exit of the light, and thus further to realize miniaturization of the black matrix and to increase the aperture ratio of the color filter substrate 130.

For example, the light converging structures 80 and the protective layer 8 are integrally formed with a photosensitive resin.

An example of the process of forming the protective layer 8 and the light converging structure 80 comprises: depositing a photosensitive resin solution on the insulating layer and the data lines 4; performing pre-baking to form a photosensitive resin layer; forming protrusions by a patterning process; performing post-baking so as to transform the photosensitive resin layer into the protective layer 8 and the light converging structures 80.

By integrally forming the photosensitive resin into the protective layer 8 and the light converging structures 80, the process required by separately forming the light converging structure 80 can be omitted and the production efficiency of the array substrate 11 can be improved.

Since convex lens structure has a better light converging effect, for example, each light converging structure 80 is implemented in a convex lens structure.

During the process of post-baking the photosensitive resin layer formed with the protrusions, the photosensitive resin layer contracts inwardly such that the protrusions form convex lens structures.

In order to better control the dimensions of the black matrix of the opposed substrate 13 corresponding to the array substrate 11, to avoid image sticking caused by light leakage of the array substrate 11, and further to better adjust the aperture ratio of the opposed substrate to improve brightness of the liquid crystal display, relevant parameters may be determined according to the requirements, for example, as shown in FIG. 3, a cross-section height "h" of the light converging structure 80 may be 0.5-1.5 μm, a cross-section width "c" of the light converting structure 80 may be 1.5-4.5 μm, and a cell thickness "d" of the liquid crystal layer 12 for example may be 2-3 μm.

Embodiment 3

Corresponding to the array substrate of the aforesaid Embodiment 1, the present embodiment further provides a preparing method of the array substrate, the method comprising the following steps:

S1, forming a shielding layer on a substrate, and forming gate lines by a patterning process.

Figure 5:
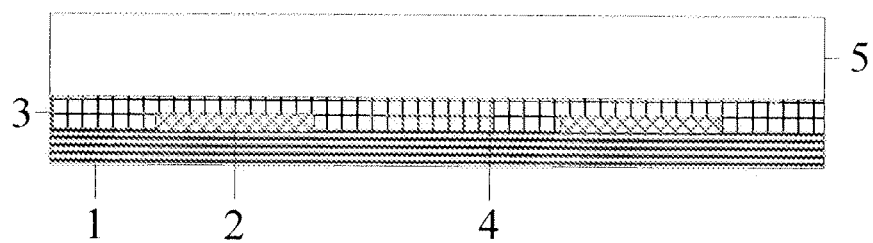
FIG. 5 is a structural schematic view after coating the substrate with photosensitive resin in the Embodiment 3 of the present invention.

A shielding layer is deposited on the substrate 1. As shown in FIG. 5, the substrate 1 for example is a glass substrate, a plastic substrate or the like. The shielding layer may be made of a material same as that for the gate electrodes (not shown) and the gate lines. It usually may also be called as a gate metal layer and is of such a metal conductive material as chromium, aluminum, molybdenum, neodymium or the like, or a non-metal conductive material. The shielding layer is coated with photoresist and the photoresist is exposed and developed by a patterning process. After the exposure and development, the shielding layer is etched for forming the gate electrodes and the gate lines 14. In one example, light blocking bars may be formed at the same time. The light blocking bars for example may be located on both sides of the gate lines, or on both sides of the data lines to be formed afterwards.

S2, forming an insulating layer.

After the light blocking bar 2 is formed, an insulating layer 3 is formed by deposition on the substrate 1 after the step S1. For example, the material of the insulating layer 3 may be nitrogen silicon, insulating resin or the like.

S3, forming data lines on the insulating layer.

For example, an active layer of the thin film transistor may be firstly formed. For example, an amorphous silicon layer (not shown) and an amorphous silicon layer doped with phosphorus elements (not shown) are formed over the gate electrodes on the insulating layer 3. The amorphous silicon layer and the amorphous silicon layer with doped elements are patterned. The material of the active layer is not limited to the aforesaid amorphous silicon layer and may also be polysilicon, oxide semiconductor or the like. Next, a metal layer is deposited over the active layer; source electrodes (not shown) and drain electrodes (not shown) of the thin film transistors and the data lines 4 may be formed by a patterning process. The data lines 4 are, for example, connected to the source electrodes respectively.

The patterning process is, for example, a photolithography process. One example of the photolithography process comprises: coating a structure layer to be patterned with a photoresist layer, exposing the photoresist layer using a mask plate, developing the exposed photoresist layer to obtain a photoresist pattern, etching the structure layer using the photoresist pattern, and then optionally removing the photoresist pattern if desired.

S4, forming light converging structures on the protective layer over the gate lines and/or the data lines by a patterning process.

Figure 7:
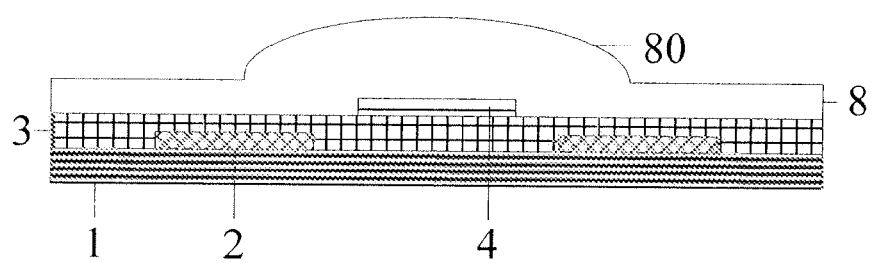
FIG. 7 is a structural schematic view when forming the light converging structure in the Embodiment 3 of the present invention.

One example of step S4, as shown in FIG. 7, comprises the following steps of S40~S43.

S40, coating a photosensitive resin solution on the substrate formed with gate lines and data lines.

After the source electrodes, the drain electrodes and data lines 4 are formed on the substrate 1, the substrate is coated with the photosensitive resin solution. For example, the material of the photosensitive resin is a mixture of phenolic resin and a photo sensitizer.

S41, pre-baking the photosensitive resin solution to form a photosensitive resin layer.

Such conditions as the temperature of pre-baking may be set according to requirements. For example, pre-baking is conducted in an environment of about 110☐ so as to volatilize the solvent (e.g., organic solvent) in the photosensitive resin solution, thus forming a photosensitive resin layer 5.

S42, exposing and developing the photosensitive resin layer using a half-tone mask plate or a grey-tone mask plate, forming protrusions in a completely shielding region.

If the half-tone mask plate is adopted, the half-tone mask plate 6 comprises a half-tone region 61 and a completely shielding region 60 thereon; if the grey-tone mask plate is adopted, the grey-tone mask plate 7 comprises a grey-tone region 71 and a completely shielding region 70 thereon. The following description is provided by taking the half-tone mask plate 6 for example.

Figure 6:
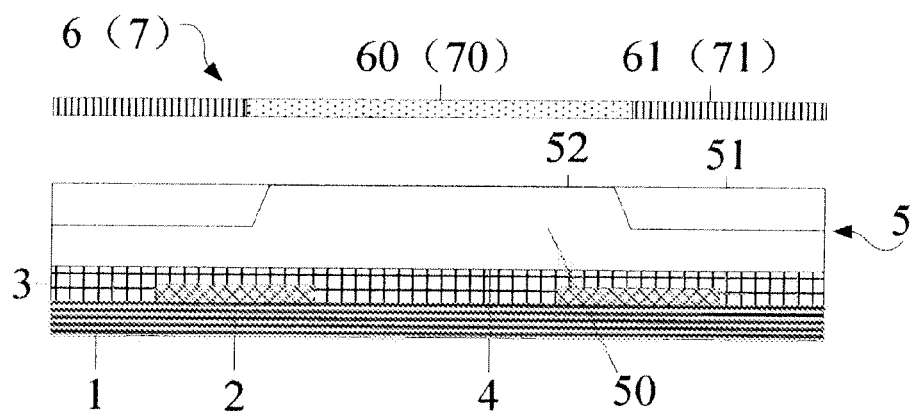
FIG. 6 is a structural schematic view when exposing and developing the photosensitive resin layer in the Embodiment 3 of the present invention.

The photosensitive resin layer 5 is shielded by the half-tone mask plate 6, as shown in FIG. 6, and exposure is performed such that the upper part photosensitive resin material of the partially exposure region 51 of the photosensitive resin layer 5 corresponding to the half-tone region 61 becomes an acid material, while the unexposed region 52 maintains the original characteristics of the photosensitive resin. The exposed substrate 1 is put into a developing liquid for development. Since the developing liquid is alkali, it reacts with the upper part photosensitive resin layer 5 of the partially exposure region 51 that is become acid. The upper part photosensitive resin layer 5 of the partially exposure region 51 is removed and lower part photosensitive resin layer 5 of the partially exposure region 51 remains as a protective layer. At the same time, a protrusion 50 is formed on the photosensitive resin layer 5 of the unexposed region 52 corresponding to the completely shielding region 60, wherein the protrusion 50 is of a shape similar to a trapezoid. If desired, for example, a via hole may be further formed in the protective layer, and the half-tone mask plate 6 may further include a void region (blank region) for completely exposing the corresponding photosensitive resin part. The completely exposed photosensitive resin part is completely removed during the development process.

In this example, the photosensitive resin material is a positive photosensitive material, i.e., the exposed region is removed during the development process. In another example, the photosensitive resin material may also be a negative photosensitive material, i.e., the exposed region is retained during the development process.

The process of exposure and development using the grey-tone mask plate 7 is identical to that using the half-tone mask plate. The grey-tone region 71 corresponds to the partially exposure region. No more details are given herein for simplicity.

S43, curing the photosensitive resin layer by post-baking heating, and transforming the protrusions to form convex lens structures as the light converging structures.

The substrate 1 is heated by post-baking, and the temperature of the post-baking heating may be set according to practical situations. By post-baking heating, the photosensitive resin layer 5 and the formed protrusions 50 are gathered and contracted inwardly, and the edge of the protrusions 50 becomes smoother. During the continuous heating process, the protrusions 50 and the photosensitive resin layer 5 are cured. As shown in FIG. 7, a second insulating layer 8 and a light converging structure 80 are formed after the post-baking process.

In the process of curing the photosensitive resin layer 5, in order to avoid such problems as stripping off of the protective layer 8 caused by low adhesiveness due to excessive low temperature of the post-baking, for example, the temperature of the post-baking heating may be set at 110-150° C. After the post-baking at the temperature, the protective layer 8 formed by curing will have better adhesiveness.

S5, forming pixel electrodes on the protective layer, wherein the pixel electrodes are located on both sides of the light converging structure.

Figure 8:
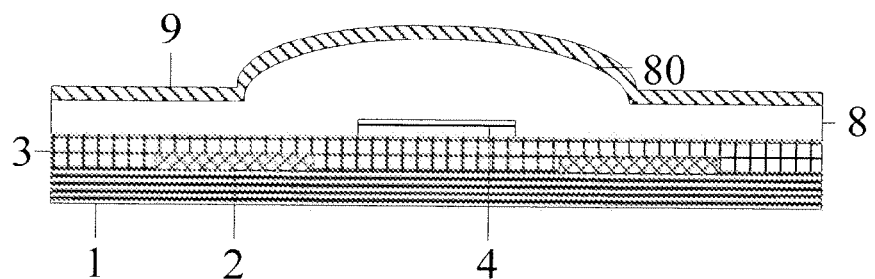
FIG. 8 is a structural schematic view when forming the pixel electrode layer in the Embodiment 3 of the present invention.

If desired, pixel electrodes may be further formed after forming the protective layer 8. The material for forming pixel electrodes, e.g., indium-tin oxide, indium-zinc oxide or the like, are deposited on the protective layer 8 so as to form a pixel electrode film 9. As shown in FIG. 8, the deposited pixel electrode film 9 will cover the light converging structures 80. The pixel electrode film 9 may be patterned using a patterning process. The pixel electrode film 9 is coated with photoresist 9, and the photoresist over the light converging structures 80 is removed by photolithography process. The pixel electrode film 9 over the convex lens structures 80 is etched and removed, such that the pixel electrode film 9 forms pixel electrodes 90 on both sides of the light converging structures 80. Up to now, the array substrate 11 shown in FIG. 1 is obtained.

In addition, the array substrate 11, if needed, may further comprise a common electrode layer for cooperating with the pixel electrodes in order to form electric fields for driving liquid crystal. The common electrode may be formed on a same layer as or on a different layer from that of the pixel electrodes. In the present embodiment, there is no need for the corresponding opposed substrate to be provided with a common electrode layer.

In another embodiment, the pixel electrodes may be formed on and under the protective layer 8 (the light converging structures 80). That is, the pixel electrodes may be formed prior to the formation of the protective layer, where the protective layer is made of a transparent material.

Embodiment 4

In the array substrate 11 prepared by the above steps, since the protective layer 8 is formed by photosensitive resin material, which may comprise such structures as photosensitive groups and may present a color of light yellow, the liquid crystal display prepared by the array substrate 11 may have the problem of lower transmittance, or discoloration when the light transmits the TFT array substrate 11, such that the displayed color becomes dull or has deviation.

Furthermore, the following treatments may be performed after heating by post-baking, curing the photosensitive resin layer and the protrusions to form convex lens structures as the light converging structures, as shown in FIG. 5.

S44, bleaching the cured protective layer and light converging structures by ultraviolet so as to make the protective layer and the light converging structures faded.

After the photosensitive resin layer 5 is heated by post-baking to be cured into the protective layer 8, it is bleached by ultraviolet, i.e. by irradiating the protective layer 8 using ultraviolet such that the photosensitive groups in the photosensitive resin forming the protective layer 8 react. The photosensitive groups fade such that the protective layer 8 becomes a water-white and transparent structure, thus preventing the liquid crystal display prepared by the array substrate 11 from such problems as lower transmittance or deviation of the displayed color.

The embodiments of the present invention provide an array substrate, a display panel and a preparing method thereof. Over the protective layer on the gate lines and data lines, light converging structures corresponding to the gate lines and/or said data lines are formed by a patterning process, so as to converge the light emitted from the protective layer in the positions of the gate lines and/or data lines. The lights which might have been leaked out from both sides of the black matrix arrive, after convergence, at the region where the black matrix is located so as to prevent light leakage. Thus, the dimensions of the black matrix for shielding the exit lights to avoid image sticking are reduced, and the aperture ratio of the opposed substrate is increased.

The aforesaid embodiments of the present invention are given by way of illustration only and thus are not limitative of the protection scope of the present invention, which is determined by the attached claims.

What is claimed is that:

1. An array substrate comprising: a substrate, a gate line and a data line disposed on the substrate, a protective layer covering the gate line and/or the data line,
    wherein a light converging structure is disposed on the protective layer over the gate line and/or the data line;
    wherein the light converging structure is configured in a single convex lens structure, and
    wherein a black matrix corresponding to the gate line and the data line is disposed at a focal plane of the single convex lens structure.

2. The array substrate according to claim 1, wherein the light converging structure and the protective layer are integrally formed with a photosensitive resin layers.

3. The array substrate according to claim 1, wherein pixel electrodes are disposed on both sides of the light converging structure.

4. The array substrate according to claim 2, wherein pixel electrodes are disposed on both sides of the light converging structure.

5. The array substrate according to claim 1, wherein a cross-section height of the convex lens structure is 0.5-1.5 μm, and a cross-section width of the convex lens structure is 1.5-4.5 μm.

6. A display panel, comprising an array substrate according to claim 1.

7. The display panel according to claim 6, further comprising an opposed substrate disposed opposite to the array substrate, wherein the opposed substrate comprises a black matrix.

8. A preparing method of an array substrate, the array substrate comprising: a substrate, a gate line and a data line disposed on the substrate, a protective layer covering the gate line and/or the data line, and a light converging structure disposed on the protective layer over the gate line and/or the data line, the method comprising:
    forming the gate line and the data line on the substrate;
    forming the protective layer on the gate line and the data line; and
    forming the light converging structure on the protective layer over the gate line and/or data line, wherein the light converging structure is configured in a single convex lens structure, and wherein a black matrix corresponding to the gate line and the data line is disposed at a focal plane of the single convex lens structure.

9. The method according to claim 8, wherein forming the protective layer and the light converging structure on the protective layer comprises:
    coating a photosensitive resin solution on the substrate formed with the gate line and data line;
    pre-baking the photosensitive resin solution to form a photosensitive resin layer;
    exposing and developing the photosensitive resin layer using a half-tone mask plate or a grey-tone mask plate, so as to form the protective layer and a protrusion on the protective layer; and
    curing the photosensitive resin layer by post-baking heating, and transforming the protrusion to form a convex lens structure as the light converging structure.

10. The method according to claim 9, after curing the photosensitive resin layer by post-baking heating and transforming the protrusion to form a convex lens structure as the light converging structure, further comprising:
    bleaching the cured protective layer and the light converging structure by ultraviolet so as to make the protective layer and the light converging structure fade.

11. The method according to claim 9, wherein the temperature of the post-baking heating is at 110-150° C.

12. The method according to claim 8, after forming the light converging structure on the protective layer over the gate line and/or data line, further comprising:
    forming pixel electrodes on the protective layer, wherein the pixel electrodes are located on both sides of the light converging structure.

* * * * *